United States Patent

[11] 3,626,315

[72] Inventors Ronald C. Stirling
Clearwater, Fla.;
John L. Barnum, San Jose, Calif.
[21] Appl. No. 26,273
[22] Filed Apr. 7, 1970
[45] Patented Dec. 7, 1971
[73] Assignee Sperry Rand Corporation

[54] VOLTAGE-CONTROLLED OSCILLATOR SELECTIVELY INJECTION LOCKED TO STABLE FREQUENCY HARMONICS
8 Claims, 2 Drawing Figs.

[52] U.S. Cl. .......... 331/19, 331/38, 331/47, 331/77, 331/172, 331/179
[51] Int. Cl. .......... H03b 3/06, H03b 3/08, H03b 21/02
[50] Field of Search .......... 331/19, 38, 40, 47, 50, 52, 54, 55, 75–77, 172, 177 R, 177 V, 179

[56] References Cited
UNITED STATES PATENTS
3,304,518 2/1967 Mackey .......... 331/55 X

*Primary Examiner*—Roy Lake
*Assistant Examiner*—Siegfried H. Grimm
*Attorney*—S. C. Yeaton

ABSTRACT: A signal source and harmonic signal selector for application in frequency-coherent signal generators or synthesizers and in precision radio communication systems features a novel frequency conversion process to obtain pluralities of selectable stable frequency signals from one source. A stable oscillator is employed to excite the desired plurality of signals in a harmonic comb generator. An injection oscillator, controlled by a selected unidirectional voltage level, is used as a filter to select a desired one of the array of harmonically related signals. Means are provided for purifying the spectrum of the selected output signal.

PATENTED DEC 7 1971 3,626,315

INVENTORS
RONALD C. STIRLING
JOHN L. BARNUM
BY
H P Terry
ATTORNEY

VOLTAGE-CONTROLLED OSCILLATOR SELECTIVELY INJECTION LOCKED TO STABLE FREQUENCY HARMONICS

BACKGROUND OF THE INVENTION

1. Field of the Invention

The invention relates to the art of coherent frequency signal generators or synthesizers that generate multiplicities of stable selectable frequency signals whose stability generally depends upon the stability of fixed-frequency oscillators and whose generation depends upon the generation and selection of multiples of harmonics of the signal from the stable frequency source. More particularly, the invention relates to improved means for generating related signals separated by very small frequency intervals by the simple switching of unidirectional voltage levels in a manner eliminating the need of complex radiofrequency apparatus employed in the past for performing that function.

2. Description of the Prior Art

Frequency-coherent signal generators or synthesizers of the prior art have generally used a precise frequency standard or reference signal source and a frequency conversion process to obtain pluralities of signals having stable output frequencies from the one source, usually selectable on a decimal-digit basis. Generally, each output signal is individually selected by a frequency selector and has substantially the frequency stability of the standard frequency source. Generally, the output frequencies are multiples of harmonic fractions of the signal from the standard frequency source.

One form of prior art frequency synthesizer, sometimes called the direct synthesizer, has a repetitive system of amplifiers, multipliers, dividers, and mixers for use in the frequency conversion process. The direct frequency synthesizer performs strictly arithmetic operations on the reference or standard signal. That is, it electronically adds, subtracts, multiplies, or divides the reference frequency to obtain a desired output. While the selected output signal is precisely related to the standard or reference signal, a system of complex filters is necessary. With the multiplicity of components required, such synthesizers become quite complex and costly and are not suited for use where apparatus of relatively light weight is needed. Furthermore, even with careful design of the filters and with careful selection of the values of the frequencies of the signals to be mixed, undesired low-level signals often appear quite close to the frequency of the desired signal.

Switching from one desired output signal to another of different frequency in the direct synthesizer may be a complex problem where arbitrarily small frequency increments are desired of the order, for instance, of 100 kHz. spacing between 3.0 and 3.9 MHz. For example, one equipment has an arrangement for selecting such harmonics using 10 narrow-band filters simultaneously to select 3.0, 3.1, 3.2,.. .3.9 MHz. signals, followed by a bank of 10-pole radiofrequency switches to select the one desired harmonic. Such a technique is evidently both costly and complex.

Frequency synthesizers have also used an alternative approach, sometimes called the indirect synthesizer method, in which an output signal of the required frequency is obtained from a locked oscillator. Indirect synthesizers use a comb harmonic generator and a phase-locking technique to select the desired output frequency. The speed of switching from one output signal to another is relatively unsatisfactory for many applications. Complexity is not significantly avoided.

For example, the switching problem in one type of indirect synthesizer is attacked by use of a phase-locked servo loop as a filter to select the desired harmonic signal. A voltage-controlled oscillator is used that covers the range, for example of 3.0 to 3.9 MHz. It is used to match a reference signal in a comb spectrum covering the 3.0 to 3.9 MHz. frequency range in 100 kHz. increments, the voltage-controlled oscillator phase locking to be desired harmonic. The technique is again both costly and elaborate, as there is required a voltage-controlled oscillator, a summing amplifier, a loop filter, and a phase detector for each digit.

SUMMARY OF THE INVENTION

The invention is a frequency-coherent generator or synthesizer system capable of generating a large array of frequency-related signals and providing means for ready selection of any one signal of a desired stable frequency. The invention provides simple means for generating and selecting stable frequency-related signals separated by very small frequency increments.

The signal array is generated initially by using a stable oscillator to excite a harmonic comb generator to produce the plurality of harmonically related signals. These signals are supplied to an injection voltage-controlled oscillator for selection of discrete frequency.

The injection voltage-controlled oscillator is of the type which can be set to oscillate in the vicinity of a desired frequency by simple adjustment of a controlled unidirectional voltage applied to one of its control terminals. Set approximately by a selected unidirectional voltage level so applied, the injection oscillator is capable of locking stably on the nearest frequency signal of the array of signals injected into it by the harmonic comb generator. Thus, the oscillator behaves like a filter, selecting the desired component of the output of the harmonic comb generator.

Still present in the output spectrum of the oscillator, though at a very low level, are nonselected components of the harmonic comb spectrum. These are removed by a hard limiter or squaring circuit. Since the squaring circuit produces undesired harmonics of the selected frequency, they are removed by a low-pass filter, which thus provides a selected-frequency output signal of desired spectral purity.

The inventive synthesizer may be used readily to provide selectable frequency input signals, spaced at small frequency increments, as inputs, for instance, to the type of signal frequency generator commonly known as the direct synthesizer which, with a repetitive system of amplifiers and frequency dividers, multipliers, and mixers, provides additional selectable frequency conversion capability through performance of arithmetic operations on its input signals.

DESCRIPTION OF THE PREFERRED EMBODIMENT

Figure 1:
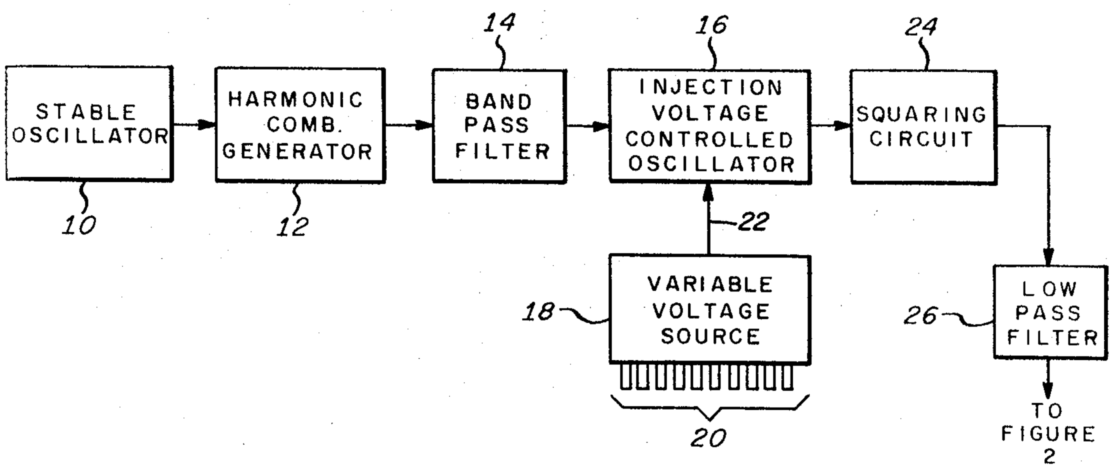
FIG. 1 is a schematic block diagram illustrating a preferred form of the invention.

Referring to FIG. 1, the inventive signal source and harmonic selector is shown to use a signal from a stable sine wave oscillator 10, whose output is supplied as an input to harmonic comb generator 12. Generator 12 may be selected from known devices which generate a comb spectrum; e.g., which generate a plurality of harmonically related frequencies of substantial amplitude over an arbitrary range of frequencies, harmonics which are integrally related to the frequency of the output of oscillator 10 and are, as a consequence, spaced by equal frequency increments. The output of harmonic comb generator is supplied to band-pass filter 14.

Band-pass filter 14 rejects those harmonic frequency signals from the arbitrary range of frequencies generated by generator 12 that fall on either side of a desired range of harmonic frequencies. Only the desired frequency range of harmonic signals is then applied to the input of voltage-controlled oscillator 16.

Oscillator 16 is of the particular type known in the industry as an injection-locking voltage-controlled oscillator, and the spectrum of signals supplied by filter 14 is applied to its injection port. Another input to oscillator 16 is an arbitrarily variable unidirectional voltage supplied by voltage control source 18. Voltage source 18 is any convenient source having, for example, 10 switchable output taps each capable of supplying a discrete unidirectional voltage. When one of the switches or keys 20 is manually actuated, lead 22 supplies a predetermined voltage to oscillator 16. Voltages at various steps distant from the first voltage may be successively supplied by actuating other switches or keys, releasing each formerly operated key.

Oscillator 16 serves, in effect, as a filter, passing primarily one element of the comb spectrum fed to its input, as will be discussed in more detail hereinafter. In fact, however, the output of locked oscillator 16 is not a signal of purely a single frequency, so that a conventional squaring circuit 24 is used to reject substantially all but the signal of selected frequency. Squaring circuit 24 operates on the output of oscillator 16 and supplies an input to low-pass filter 26, where any remaining spurious signals in the form of odd or even harmonics of the selected signal are removed.

By way of example, the operator of the system of FIG. 1 will now be discussed in terms of a particular configuration utilizing signals of particular frequencies. Consider the situation in which generation and selection is to be obtained of a signal component from the array of frequencies 3.0, 3.1, 3.2,... 3.9 MHz. (signals at 100 kHz. spacings). The stable oscillator 10 will therefore be selected to provide a 100 kHz. sine wave at the input of harmonic comb generator 12.

Harmonic generator 10 will generally produce a comb or picket fence array of signal at 100 kHz. intervals covering the 3.0 to 3.9 MHz. span, but also necessarily extending on past both ends of that span. When the array is passed to band-pass filter 14, only signals at 100 kHz. intervals from 3.0 to 3.9 MHz. are passed thereby. This spectrum is the signal applied to the injection input port of voltage-controlled oscillator 16.

By operation of a key or switch 20 on variable-voltage source 18, voltage-controlled oscillator 16 has been tuned in a well-known manner to an oscillation frequency very close to one of the components of the comb array applied at its injection port. This differential frequency is spoken of in the industry as defining the locking range of the injection oscillator 16, so that its oscillation frequency instantaneously jumps to that of the input frequency component, oscillator 16 locking thereon. As is known in the art, the locking range is uniquely defined by the level of the locking signal, the level of the original oscillation signal at the point of injection, and the effective quality factor Q of the oscillator tuned circuit. These parameters are adjusted in the design of the apparatus to yield a locking range compatible with anticipated variations in the variable-voltage source 18 due to temperature drift, aging, and the like. Other locked oscillation choices are similarly selected by turning the output frequency of oscillator 16 to a frequency near other desired harmonic components of the comb array of frequencies by operation of any other one of the switches or keys 20, thus supplying any selected one of, for instance, 10 different unidirectional voltages to oscillator 16. Source 18 may, for example, consist of a battery with 10 potentiometers connected across it, each coupled to a tap of a 10-pole switch. Upon operation of the tap, any one of 10 voltages is individually selected for application to oscillator 16.

While actual frequency selection is accomplished by oscillator 16, its output still contains a notable, though greatly reduced, content of the other original harmonic spectral components passed by band-pass filter 14. While the unwanted signals are at a relatively low level compared to the selected signal, they are spurious signals and must be removed to attain the spectral purity desired for frequency synthesizers to be used in modern laboratory or communication application.

Accordingly, the output of oscillator 16 is supplied to squaring circuit 24 so as to improve its spectral purity. This circuit is a conventional threshold squaring circuit which acts, in effect, as a hard limiter, converting the selected input sine wave into a square wave. By virtue of its hard limiting action, substantially all unwanted signals are eliminated, and the selected signal from the 3.0 to 3.9 MHz. comb spectrum is passed to the output of circuit 24.

The squaring circuit 24 does produce large amounts of power of odd harmonics of the selected frequency and, unless an absolutely symmetric square wave is produced, it also generates some even harmonic energy. These unwanted signals are, however, all of frequency above the desired output range (3.0 to 3.9 MHz). Accordingly, the output of squaring circuit 24 is applied to a low-pass filter 26. Filter 26 has a 4 MHz. upper cutoff so that its output contains only the selected signal in the 3.0 to 3.9 MHz. range, thus achieving the desired spectral purity.

Figure 2:
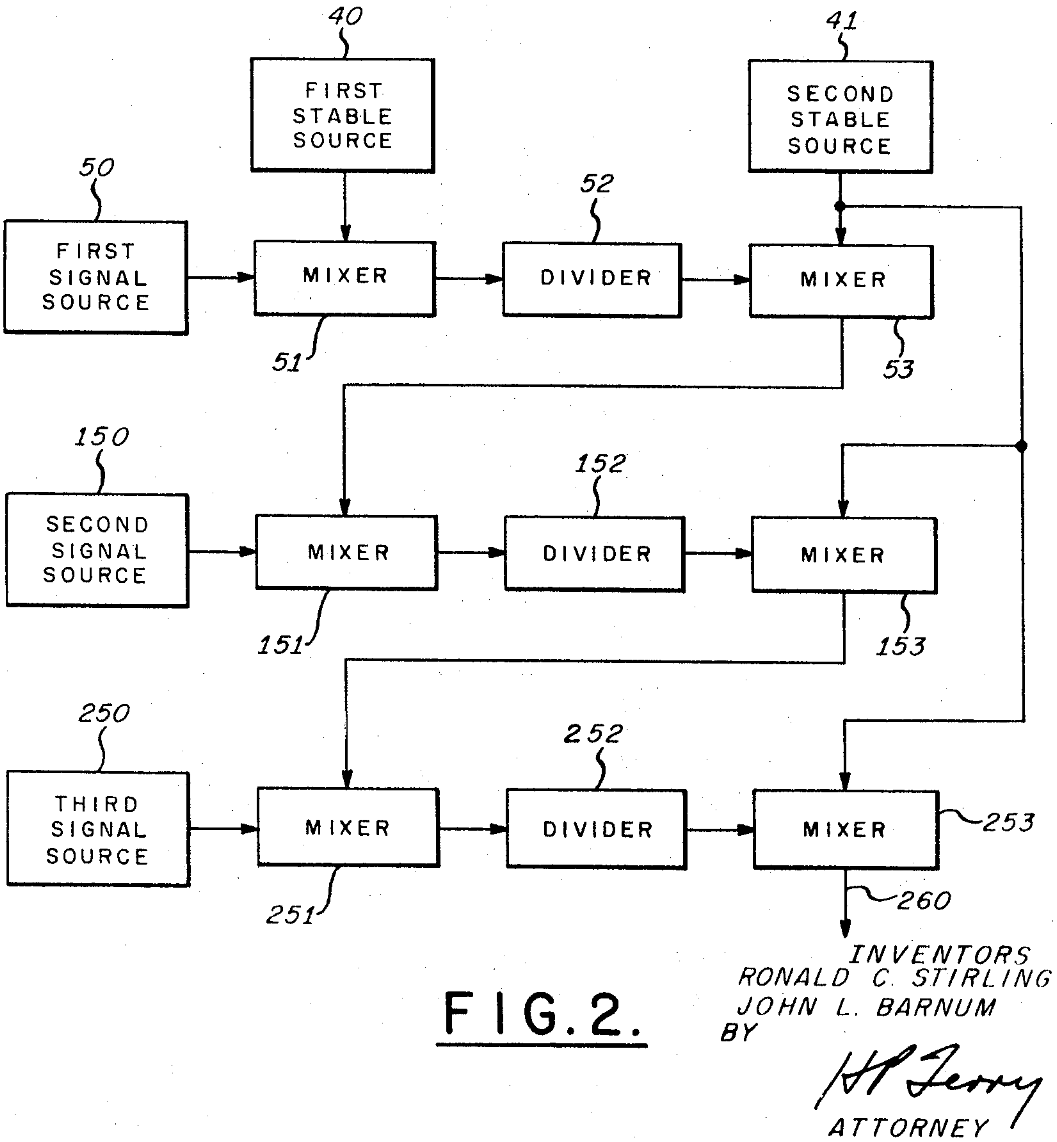
FIG. 2 is a schematic block diagram showing the invention used in a representative signal generator system.

The structure of the invention and its manner of operation are both evident from the foregoing discussion of FIG. 1. FIG. 2 illustrates one possible application of the invention and particularly shows how the arrangement of FIG. 1 is used in a known direct type of frequency synthesizer so as to provide the benefits of the direct synthesizer approach in an instrument employing what can perhaps be said to represent a quasi-direct synthesizer concept, the combination offering over all a relatively less complex system with switching speed superior to those obtainable in indirect systems and comparable to the speeds of the more complex prior art direct synthesizer.

In the total frequency synthesizer apparatus of FIG. 2, it is desired, for instance, to be able at will to generate any arbitrarily selected signal lying at 100 Hz. frequency spacings between 17.0000 and 17.0999 MHz. To effect such a result, mixer-divider-mixer arrays are employed in connection with three individual signal sources 50, 150, and 250 each in structure and operation like the apparatus disclosed in FIG. 1. Sources 50, 150, 250 each generate selectable signals lying, for instance, at 100 kHz. Spacings between 3.0 and 3.9 MHz. Operation of the system, as is well understood from the prior art, also depends upon the presence of two stable signals in the megahertz region. These may be provided from a single stable source. However, in FIG. 2, as a matter of convenience, they are shown as originating in the respective first and second stable sources 40 and 41.

Examining the role of the mixer 51-divider 52-mixer 53 array, it is seen that a signal of frequency selected by the apparatus of FIG. 1 is mixed (51) with, for instance, a 17 MHz. signal from source 40, yielding a selected incremental frequency signal lying between 20.0 and 20.9 MHz. When its frequency is divided by 10 in divider 52, the output of the divider is applied to mixer 53 along with, for instance, a 15 MHz. signal from source 41. The yield of mixer 53 is a selected incremental frequency signal lying between 17.00 and 17.09 MHz.

A second similar mixer 151-divider 152-mixer 153 array cooperates in a similar way with a selected incremental frequency signal selected by operation of apparatus like that in FIG. 1 when used as the second signal source 150 of FIG. 2. A selected one of any 100 kHz. spaced-apart frequencies between 3.0 and 3.9 kHz. is applied to mixer 151. Simultaneously, a selected one of any 10 kHz. spaced-apart frequency between 17.00 and 17.09 MHz. is applied from mixer 53. The yield is a signal of frequency at a selected 10 kHz. increment between 20.00 and 20.99 MHz. After subjection to divide-by-10 circuit 152, the yield is a signal lying between 2.000 and 2.099 MHz. of a particular incremental value. Mixed again with the 15 MHz. output of source 41, the yield is a selected incremental frequency signal lying between 17.000 and 17.099 MHz. Any signal at 1 kHz. frequency intervals may be selected by operation of the respective first and second signal sources 50 and 150.

What may be a final stage employs a third signal source 250 like the apparatus of FIG. 1 and a mixer 251-divider 252-mixer 253 array again cooperates in a similar way with the above-selected incremental frequency signal. A selected one of and 100 kHz. spaced-apart frequencies between 3.0 and 3.9 MHz. is applied to mixer 151. At the same time, a selected one of any 100 kHz. spaced-apart frequency between 17.000 and 17.099 MHz. is provided at a selected 1 kHz. frequency increment between 20.000 and 20.999 MHz. When coupled through divide-by-10 circuit 252, the yield is a signal lying between 2.0000 and 2.0999 MHz. of a particular incremental frequency value. Mixed again with the 15 MHz. output of source 41, the yield is a selected incremental signal lying between 17.000 and 17.0999 MHz. Any one signal at a 100 kHz. interval has been selected at the output 260 by operation of the respective first, second, and third sources 50, 150, and 250.

It is seen from the above examples that the invention performs the role of a versatile stable signal source and signal selector for application in frequency-coherent signal generator systems, the invention featuring simple and novel means for frequency conversion and for obtaining pluralities of individually selectable stable frequency signals. An injection oscillator performs the selection of a given stable frequency signal in the invention by simple manual selection of a unidirectional voltage level applied to one of its control terminals. Relatively simple circuits assure spectral purity of the output of the selector circuit. Complex arrays of filters required in prior art apparatus are no longer required. Most important, signal frequency selection is done by the simple switching of unidirectional voltages and switching of radiofrequency signals is eliminated. Complex apparatus required by other approaches used in the prior art are similarly eliminated.

While the invention has been described in its preferred embodiment, it is to be understood that the words which have been used are words of description rather than of limitation, and that changes within the purview of the appended claims may be made without departing from the true scope and spirit of the invention in its broader aspects.

We claim:

1. In a signal generator:

means for supplying an input signal including a selectable frequency component desired for selection, an injection voltage-controllable oscillator for receiving said input signal and for selecting said selectable frequency component by locking on said selectable frequency component, hard limiter means for acting on the output of said voltage-controllable oscillator for the purpose of removing said input signal components other than the selectable frequency component desired for selection, and means responsive to the output of said limiter.

2. Apparatus as described in claim 1 including low-pass filter means for receiving the output of said hard limiter means for the purpose of removing from said output any harmonics of the selected frequency.

3. Apparatus as described in claim 1 including voltage control means for causing said injection voltage-controllable oscillator to oscillate at a frequency such that it will instantaneously move to said selectable frequency and lock in thereon, producing an output wave including said selected frequency as its strongest component.

4. Apparatus as described in claim 1 wherein said means for supplying an input signal includes a stable oscillator.

5. Apparatus as described in claim 1 wherein said means for supplying an input signal includes a harmonic comb generator for producing a signal array having a comb frequency spectrum.

6. Apparatus as described in claim 5 wherein the range of the said comb frequency spectrum is limited in extent by a band-pass filter.

7. Apparatus as described in claim 3 wherein:

said means for supplying an input signal includes a generator of frequency-related signals, said voltage control means includes manual means for supplying predetermined incrementally different voltages to said injection voltage-controllable oscillator to select any one of different oscillation frequencies in aid oscillator each of which substantially matches a frequency component produced by said generator of frequency-related signals.

8. Apparatus as described in claim 7, wherein said means responsive to the output of said limiter comprises signal-processing means including:

first and second stable signal source means, first mixer means supplied with the output of said first stable signal source means, frequency divider means supplied with the output of said first mixer means, and second mixer means supplied with the outputs of said frequency divider means and of said second stable signal source means.

* * * * *